US012750988B2

(12) United States Patent
Drofenik et al.

(10) Patent No.: US 12,750,988 B2
(45) Date of Patent: Sep. 29, 2026

(54) CONVERTER AND METHOD OF OPERATING A CONVERTER

(71) Applicants: ABB E-Mobility B.V., Delft (NL); ABB Schweiz AG, Baden (CH)

(72) Inventors: Uwe Drofenik, Zürich (CH); Francisco Canales, Baden-Dättwil (CH); Francisco Garcia-Ferre, Baden (CH); Daniel Rothmund, Mülligen (CH); Piotr Czyz, Zürich (CH)

(73) Assignees: ABB E-Mobility B.V., Delft (NL); ABB Schweiz AG, Baden (CH)

( * ) Notice: Subject to any disclaimer, the term of this patent is extended or adjusted under 35 U.S.C. 154(b) by 306 days.

(21) Appl. No.: 18/654,129

(22) Filed: May 3, 2024

(65) Prior Publication Data

US 2024/0373602 A1 Nov. 7, 2024

(30) Foreign Application Priority Data

May 4, 2023 (EP) .................................... 23171597

(51) Int. Cl.
*H05K 7/20* (2006.01)
*H02M 7/00* (2006.01)

(52) U.S. Cl.
CPC ........ *H05K 7/20927* (2013.01); *H02M 7/003* (2013.01)

(58) Field of Classification Search
CPC ........ H05K 7/14; H05K 7/14325; H05K 7/20; H05K 7/20927; H05K 7/20936;
(Continued)

(56) References Cited

U.S. PATENT DOCUMENTS

2010/0321889 A1* 12/2010 Yoshino ............. H05K 7/20927 361/702
2012/0327602 A1* 12/2012 Kulkarni ............ H05K 7/14325 361/700

(Continued)

FOREIGN PATENT DOCUMENTS

| | | | |
|---|---|---|---|
| EP | 4099347 | A1 | 12/2022 |
| WO | 2012098107 | A2 | 7/2012 |
| WO | 2021115966 | A1 | 6/2021 |

OTHER PUBLICATIONS

European Extended Search Report, Application No. 23171597.0, dated Nov. 10, 2023, 6 pps.

*Primary Examiner* — Amir A Jalali
(74) *Attorney, Agent, or Firm* — McCarter & English, LLP

(57) ABSTRACT

A converter is provided. The converter includes at least one medium voltage stage including an inverter circuit, at least one medium frequency transformer, a first winding of the transformer being electrically connected to the medium voltage stage, at least one DC output stage, the DC output stage being electrically connected to a second winding of the medium frequency transformer, and a plurality of containers having a volume. Each container is configured for holding an insulating fluid inside the volume. Each container has provided within the container one of the at least one medium frequency transformer to be electrically insulated by the fluid. The container includes at least one connector for fluidly connecting the volume with a fluid circuit. A first container of the plurality of containers is fluidly connected to a second container of the plurality of containers via the connector.

18 Claims, 3 Drawing Sheets

(58) Field of Classification Search

CPC ........ H05K 5/067; H02M 7/00; H02M 7/003; H02M 7/04; H02M 7/49; H02M 7/493; H02M 7/537; H02M 7/53875; H02M 1/007; H02M 1/0074; H02M 1/008; H02M 1/32; H02M 3/003; H02M 3/285; H02M 3/33571; H02M 3/33573; H02M 3/33576; H02M 3/33584; H02M 5/4585; H01F 27/12

See application file for complete search history.

(56) References Cited

U.S. PATENT DOCUMENTS

| | | | | |
|---|---|---|---|---|
| 2017/0280577 | A1* | 9/2017 | Laneryd | H05K 7/20236 |
| 2017/0316864 | A1 | 11/2017 | Ettl | |
| 2020/0395159 | A1* | 12/2020 | Liu | H01F 27/16 |
| 2022/0375678 | A1* | 11/2022 | Drofenik | H01F 41/063 |
| 2023/0016771 | A1* | 1/2023 | Drofenik | H01F 27/04 |
| 2024/0290530 | A1* | 8/2024 | Drofenik | H01F 27/025 |

* cited by examiner

CONVERTER AND METHOD OF OPERATING A CONVERTER

CROSS REFERENCE TO RELATED APPLICATIONS

This patent application claims the benefit and priority of European Patent Application No. 23171597.0 filed on May 4, 2023, the disclosure of which is incorporated by reference herein in its entirety as part of the present application.

BACKGROUND

Aspects of the disclosure relate to a converter, particularly a solid state transformer, including a medium frequency transformer. Aspects of the disclosure particularly relate to the medium frequency transformer providing galvanic insulation from e.g., a medium voltage grid. Aspects of the disclosure particularly relate to efficiently providing insulation of the medium voltage side of the converter from grounded components of the converter. Aspects of the disclosure particularly relate to providing a space efficient converter. Aspects of the disclosure particularly relate to providing efficient cooling of the medium frequency transformer.

Converters and/or converter installations, such as solid state transformers, may be employed for several uses, such as converting a medium voltage AC power into a low voltage DC power, which may be utilized for electric vehicle charging, datacenter power supplies, marine, mining, solar and wind power generation, large scale battery storage, and/or hydrogen production.

Generally, a high power density of a converter beneficially provides lower material cost, lower cabinet cost, and a smaller footprint. Accordingly, increasing the power density may be desirable in some products.

Some converter systems may be air-insulated and include bushings for providing insulation between grounded and non-grounded components of the converter. In some implementations, such bushings must be able to withstand lightning impulse voltages of 75 kV and higher, and may be comparably large. The space occupied by the bushing may be detrimental to the power density of the converter.

Thus, there is a need for a converter having improved insulation and/or having an improved power density. The solutions proposed herein solve the above-stated problem at least in part.

BRIEF DESCRIPTION

In view of the above, the disclosure as set out in the appended set of claims is provided.

According to an aspect, a converter is described. The converter includes at least one medium voltage stage including an inverter circuit, at least one medium frequency transformer, a first winding of the transformer being electrically connected to the medium voltage stage, at least one DC output stage, the DC output stage being electrically connected to a second winding of the medium frequency transformer, and a plurality of containers having a volume. Each container is configured for holding an insulating fluid inside the volume. Each container has provided within the container one of the at least one medium frequency transformer to be electrically insulated by the fluid. The container includes at least one connector for fluidly connecting the volume with a fluid circuit. A first container of the plurality of containers is fluidly connected to a second container of the plurality of containers via the connector, the at least one connector including a valve for opening and/or closing the connector, wherein the valve is configured for fluidly separating the first container from the second container when the connector is closed by the valve.

According to an aspect, a method of operating a converter according to aspects and/or embodiments described herein is described. The method includes, while the fluid circuit is unobstructed by a valve, converting a medium voltage AC power into a low voltage DC power while circulating the fluid in the fluid circuit to cool the medium frequency transformer.

According to an aspect, a method of operating a converter according to aspects and/or embodiments described herein is described. The method includes, while the converter is in an unpowered state, closing one or more valves to separate at least one of the plurality of containers from the fluid circuit.

According to an aspect, a low voltage is described. A low voltage may be a voltage above 200 Volt (V), such as a voltage between 200 V-1 kV, or even 200 V-1.5 kV. According to an aspect, a medium voltage is described. A medium voltage may be voltage higher than the low voltage, such as a voltage of above 1 kV, or even of above 1.5 kV, such as a voltage between 1 kV-52 kV or 1.5 kV-52 kV, particularly between 1 kV-30 kV or 1.5 kV-30 kV. For example, a medium voltage may be a voltage received, and optionally rectified, from a medium voltage grid, such as a 10 kV grid, a 15 kV grid, a 20 kV grid, a 25 kV grid, a 30 kV grid, or even a 50 kV grid. The medium voltage grid may be e.g., a 50 Hz grid or a 60 Hz grid.

According to an aspect, a converter is described. The converter may be configured for converting a medium voltage AC power into a low voltage DC power. The low voltage DC power may be particularly useful for low voltage DC applications, such as, but not limited to, powering devices, electric vehicle charging, electrolytic processes such as hydrogen generation, and/or any of the uses described in the background section of this disclosure. The converter may be configured for providing a low voltage DC power having at least 500 Kilowatt (kW), at least 1 MW, at least 2 MW, at least 3 MW, at least 5 MW, or even at least 10 MW.

According to an aspect, the converter includes a solid state transformer. According to an aspect, the converter may be a solid state transformer. According to an aspect, the converter may include a plurality of solid state transformers.

According to an aspect, the converter includes a medium voltage stage. The medium voltage stage includes an inverter circuit. The medium voltage stage may include a line transformer, reactor and/or autotransformer, such as a line interphase transformer. The medium voltage stage may include a rectifier. The line transformer and the rectifier may form an AC/DC (sub-)converter. The AC/DC (sub-)converter may be configured for converting a medium voltage AC power, such as a power received from a medium voltage grid, into a medium voltage DC power.

According to an aspect, the medium voltage stage includes an inverter circuit. The inverter circuit may include an inverter, such as an inverter configured for switching a medium voltage DC power to provide a medium frequency AC power to a medium frequency transformer. The inverter circuit may include a plurality of semiconductor components, such as a plurality of semiconductor switches.

According to an aspect, the converter, particularly the inverter stage, the rectifier and/or the DC output stage, may include a plurality of semiconductor devices. In some embodiments described herein, the semiconductor devices may be described as transistors and/or diodes, particularly semiconductor diodes such as silicon diodes. Different types of semiconductor devices, such as switchable semiconductor devices may be provided. For example, the converter, and/or even the rectifier, may include actively switchable semiconductor devices, such as transistors and/or thyristors, such as a metal-oxide-semiconductor field-effect transistor (MOSFET), an insulated-gate bipolar transistor (IGBT), high-electron-mobility transistor (HEMT), or an integrated gate-commutated thyristor (IGCT).

According to an aspect, a medium frequency transformer (MFT) is described. The medium frequency transformer may be a transformer configured for transforming a medium frequency AC power. The medium frequency AC power may have a medium frequency. A medium frequency, according to embodiments described herein, may be understood as a frequency at or above 400 Hertz (Hz), at or above 600 Hz, at or above 800 Hz, at or above 1 kHz, at or above 2 kHz, at or above 5 kHz, at or above 10 kHz, at or above 20 kHz, at or above 50 kHz, or even at or above 100 kHz.

According to an aspect, the medium voltage stage is not galvanically insulated from the medium voltage AC power. For example, a line transformer, such as a line interphase transformer, may galvanically connect the medium voltage AC power to the medium voltage stage, particularly the rectifier. According to an aspect, the converter may be devoid of a distribution transformer for providing galvanic insulation between the medium voltage AC power and the converter. According to an aspect, galvanic insulation is provided by the MFT. In particular, a first winding of the MFT may be electrically connected to the medium voltage stage, such as the inverter circuit, and a second winding of the MFT may be galvanically insulated form the medium voltage stage. The second winding of the MFT may be electrically connected to a DC output stage. The second winding of the MFT may be electrically connected to a ground potential, and/or be connected to a circuit of the converter, such as the DC output stage, which is connected to the ground potential. Accordingly, the MFT may provide galvanic insulation between the medium voltage stage and the DC output stage. According to an aspect, the MFT may be configured to convert a medium frequency medium voltage AC power into a medium frequency low voltage AC power.

According to an aspect, the DC output stage may be configured for converting a medium frequency low voltage AC power into a low voltage DC power. The DC output stage may include a rectifier.

According to an aspect, the inverter circuit, the MFT and the DC output stage may be a DC/DC (sub-)converter configured for converting a medium voltage DC power into a low voltage DC power.

According to an aspect, the converter includes a plurality of (sub-)converters, such as a plurality of AC/DC converters and a plurality of DC/DC converters. For example, the converter may include (sub-)converters arranged in a Single-Input-Single-Output (SISO), Single-Input-Multiple-Output (SIMO), Multiple-Input-Multiple-Output (MIMO), and/or Input-Series-Output-Parallel (ISOP) topology. Likewise, a plurality of converters and/or converter modules may be provided in a SISO, SIMO, MIMO, and/or ISOP topology, e.g., to provide a single low voltage DC power from multiple medium voltage AC powers, or to provide multiple low voltage DC powers from a single medium voltage AC power. Accordingly, the converter may include a plurality of MFTs.

According to an aspect, the converter described herein may have an improved power density, and may be based on modules which may be combined according to the desired properties of the converter.

Further advantages, features, aspects, and details that can be combined with embodiments described herein are evident from the dependent claims, the description, and the drawings.

BRIEF DESCRIPTION OF THE DRAWINGS

The details will be described in the following with reference to the figures, wherein.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

Figure 1:
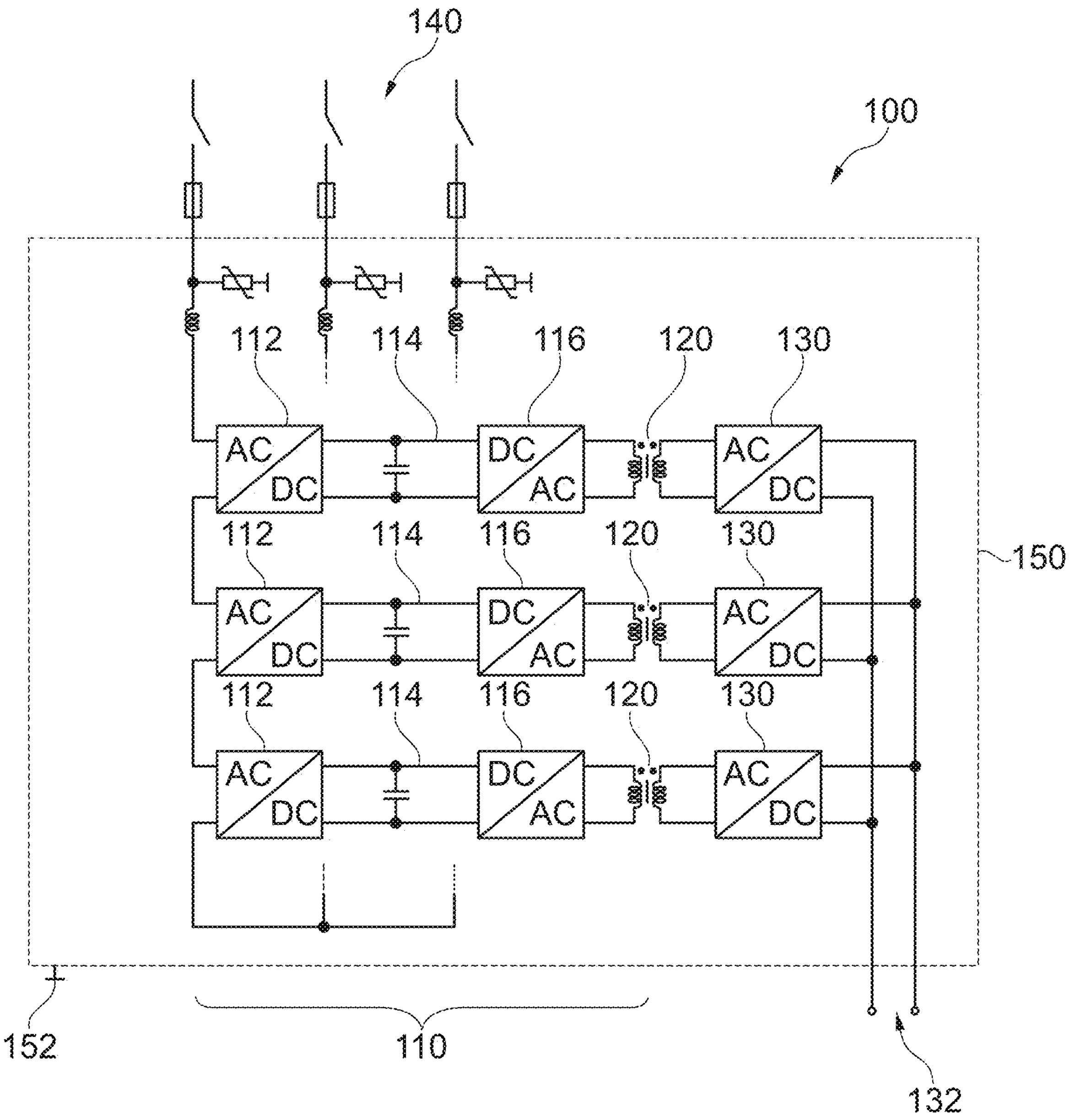
FIG. 1 shows a circuit diagram of a converter according to embodiments.

Referring now to FIG. 1, a circuit diagram of a converter 100 is shown. It should be noted that the configuration and/or topology of the converter 100 is exemplary, and other and/or different configurations may be utilized.

As shown in FIG. 1, the converter 100 includes three converter modules, each module including an AC/DC converter 112, a DC link 114 including a DC link capacitor, an inverter circuit 116, a medium frequency transformer (MFT) 120, and a DC output stage 130. Accordingly, the converter 100 may be a modular converter.

The converter 100, and/or each of the converter modules, includes a medium voltage stage 110, which may include the AC/DC converter 112, the DC link 114, and the inverter circuit 116. The MFT 120 provides an interface between the medium voltage stage 110 and the DC output stage. Accordingly, the medium voltage stage 110 may extend to a first winding of the MFT 120. In the converter 100, three AC/DC converters 112 of three modules are connected in series between phases of a three-phase medium voltage grid 140. Additional modules may be provided, e.g., connected in the configuration shown in FIG. 1 to other phases of the medium voltage grid 140.

The AC/DC converter 112 may be configured for converting a medium voltage AC power received from a grid 140 into a medium voltage DC power and/or a medium voltage DC link voltage. The medium voltage DC power may have a voltage corresponding to the voltage of the medium voltage AC power, e.g., after rectification. In particular, the AC/DC converter 112 may include a rectifier. In some embodiments, the AC/DC converter 112 may include a line transformer, such as a line interphase transformer, e.g., for improving grid harmonics and/or providing a low-ripple medium voltage DC power to the DC link 114.

In some embodiments, the medium voltage stage 110 includes an AC/AC converter. Accordingly, the AC/DC converter and/or the DC link 114 may be optional.

The medium voltage stage 110 includes an inverter circuit 116. The inverter circuit 116 may be configured for generating a medium-frequency medium voltage AC power form the medium voltage DC power. The inverter circuit 116 may be a known type of DC/AC converter, such as a half-bridge or full-bridge inverter.

The converter includes a medium frequency transformer 120. The medium frequency transformer 120 may be a medium frequency transformer as described in document WO2021115966A1, which is incorporated herein in its entirety, and/or particularly to the extent of the description of a medium frequency transformer in the document. The medium frequency transformer may be configured for transforming the medium-frequency medium voltage AC power into a medium-frequency low voltage AC power.

As shown in FIG. 1, the outputs of the three modules, i.e., the outputs of the DC output stages 130, may be connected in parallel to provide a combined low voltage DC output 132. Accordingly, the converter 100 may be a converter having an ISOP topology.

As shown in FIG. 1, the converter 100 may be surrounded by a grounded component, such as an enclosure, such as a cabinet 150 being connected to the earthing system 152 for grounding. The cabinet 150 may be provided particularly for safety reasons, and be an integral component of the converter 100 e.g., due to safety codes and/or standards. Further components of the converter may be grounded, include a connection to ground and/or include grounded components. Being grounded may be understood as being connected to an earthing system and/or being connected to a ground potential. The earthing system may define the ground potential. In particular, a core of the medium frequency transformer 120 may be grounded. In particular, components and/or parts of the DC output stage 130 may be grounded. According to embodiments, the medium voltage stage 110 may be insulated from ground. Accordingly, the MFT 120 may provide an interface between the grounded portion and the non-grounded portion of the converter 100. Accordingly, the converter 100 may include means for providing the insulation from ground, and particularly for providing the insulation of the MFT 120.

Figure 2:
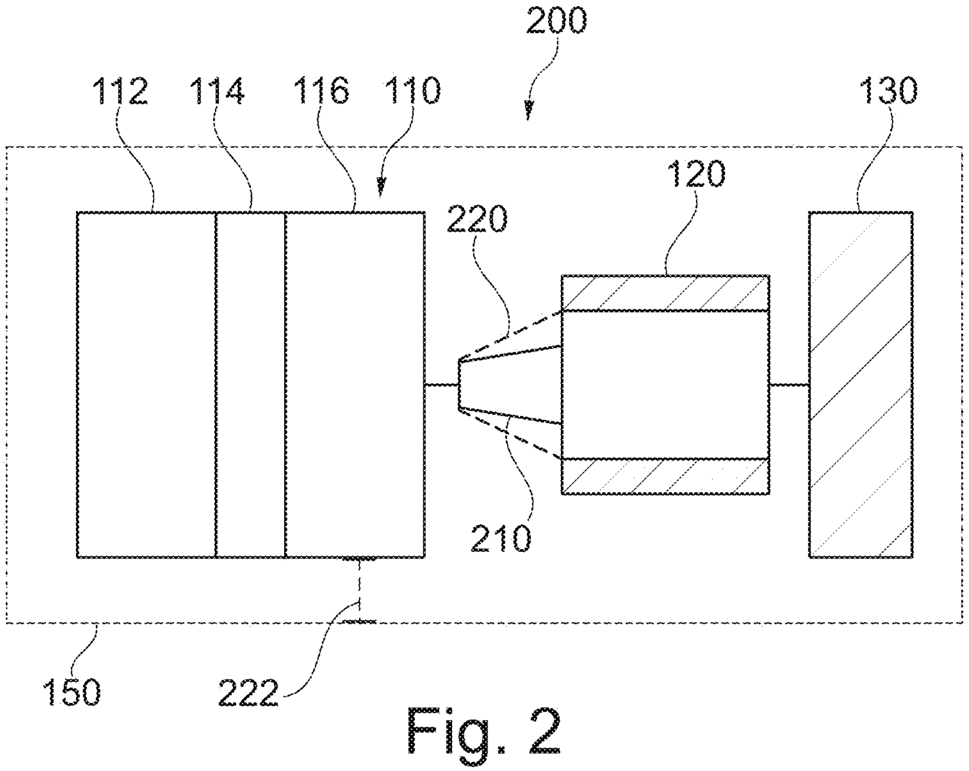
Fig. 2 PRIOR ART
FIG. 2 schematically shows a known converter.

Referring now to FIG. 2, particularly to illustrate the technical problem, an implementation of the circuit shown in FIG. 1 in a known converter 200 is described. The converter 200 has a single module which is shown schematically in a plan view, however, it should be noted that alternative configurations may be equally suitable, and the view may likewise be a side-view. Some features of the converter 200 have been omitted and/or generalized in the figure for clarity.

As shown in FIG. 2, the components of the medium voltage stage 110, particularly the AC/DC converter 112, the DC link 114 including the DC link capacitor, and the inverter circuit 116, are provided at a distance 222 from the cabinet 150. The distance 222 may be a minimum required distance, particularly a minimum required distance to provide suitable electrical insulation by air, such as a minimum required distance according to a standard such as IEC 61800-5-1.

As shown in FIG. 2, the components of the medium voltage stage 110 are provided in close proximity, or even adjacent one another. This may beneficially improve the power density of the converter.

As shown in FIG. 2, the converter 200 includes grounded components, particularly the cabinet 150. Furthermore, as indicated by the shaded portions in the figure, the DC output stage 130 may be, at least partially, connected to ground. Furthermore, portions of the MFT 120, such as a core of the MFT 120, may be connected to ground. Accordingly, the grounded portions must be insulated from the medium voltage stage.

In the example shown in FIG. 2, the insulation is provided by a bushing 210. The bushing 210 provides a minimum safe distance 220, such as a minimum required distance according to a standard such as IEC 61800-5-1, from the medium voltage stage, such as from the inverter circuit 116 and/or one or more conductors connecting the inverter circuit 116 to the MFT 120. As shown in FIG. 2, the minimum safe distance 220 may be defined as the distance between a first end of the bushing 210 and the grounded core of the MFT 120.

A disadvantage of the implementation shown in FIG. 2 is the required size of the bushing, which may generate a large space between the medium voltage stage 110 and the MFT 120.

Figure 3:
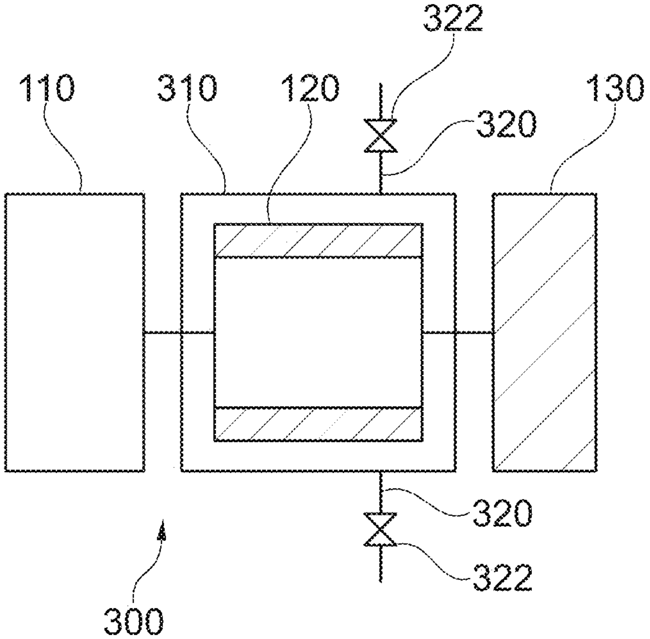
FIG. 3 schematically shows a converter according to embodiments.

Referring now to FIG. 3, a converter 300 according to an embodiment is described. The converter 300 may be a module of a converter according to embodiments, i.e., several converters 300 may be provided as modules of a converter, for example according to the circuit diagram shown in FIG. 1.

Only the differences with respect to the converter 200 shown in FIG. 2 will be described. Some features of the converter 300 have been omitted and/or generalized in the figure for clarity.

The converter 300 includes a container 310. The container 310 has a volume, such as an inside volume defined by walls and/or surfaces of the container 310. The container 310 is configured for holding an insulating fluid inside the volume. In some embodiments, the container 310 may be sealed and/or sealable. In some embodiments, the container 310 may be a housing of the MFT 120. In some embodiments, the container 310 may be provided in addition to a housing of the MFT 120.

The insulating fluid may be an electrically insulating fluid. The insulating fluid may be an oil, such as a transformer oil. Suitable fluid types include, but are not limited to, mineral oils, synthetic oils, paraffinic oils, naphthenic oils, and/or pentaerythritol tetra fatty acid natural and synthetic esters.

The container 310 has provided within the volume of the container an MFT 120. The MFT 120 may be immersed in the fluid. The fluid inside the volume electrically insulates the MFT 120. As shown in FIG. 3, the fluid inside the volume provides better insulation compared to air. Accordingly, the minimum safe distance 220 decreases, and no bushing 210 as shown in FIG. 2 is required. Beneficially, this allows the medium voltage stage 110 to be provided closer to the MFT 120, which may beneficially increase the power density of the converter.

As shown in FIG. 3, the container 310 includes at least one connector 320 for fluidly connecting the volume with a fluid circuit. In the embodiment shown in FIG. 3, the container 310 includes two connectors 320, provided at different sides of the container 310, such as opposite side walls of the container 310. The connector 320 may be a means for providing a fluid connection, such as a pipe, a hose, a conduit, or the like. The connector 320 may be at least partially provided within a surface and/or wall of the container 310, e.g., as a fitting.

According to embodiments, a single connector 320 may be utilizable e.g., for filling and/or draining the volume of the container with the insulating fluid, and/or for maintaining a desired fluid level and/or fluid pressure. In some embodiments, the container may include valves, e.g., for venting, deaeration, and/or pressure equalization with respect to the fluid circuit. For example, and not limited thereto, the container may include a bleeding valve, e.g., provided at a top wall and/or lid of the container.

In embodiments having two or more connectors 320, the connectors 320 may enable the container 310 to be incorporated within the fluid circuit, such that the volume of the container 310 forms a portion of the fluid circuit. In particular, a fluid circulating within the fluid circuit may flow into the volume through a first one of the connectors 320, and flow out of the volume through a second one of the connectors 320. Accordingly, the fluid may flow through the volume of the container 310.

As shown in FIG. 3, the connector 320 includes a valve 322. The valve 322 is configured for opening and/or closing the connector. Closing the valve 322 may fluidly separate the container 310 and/or the volume of the container 310 from the fluid circuit. In the example shown in FIG. 3, each connector 320 includes a valve 322. Accordingly, when both valves are closed, the container 310 is fully separated from the fluid circuit. Beneficially, this may allow the container 310 to be removed from the fluid circuit, particularly without otherwise preparing the fluid circuit for the removal, such as by e.g., draining the fluid circuit. Accordingly, a MFT 120 provided within the container may be easily accessed, e.g., for maintenance and/or replacement.

Figure 4:
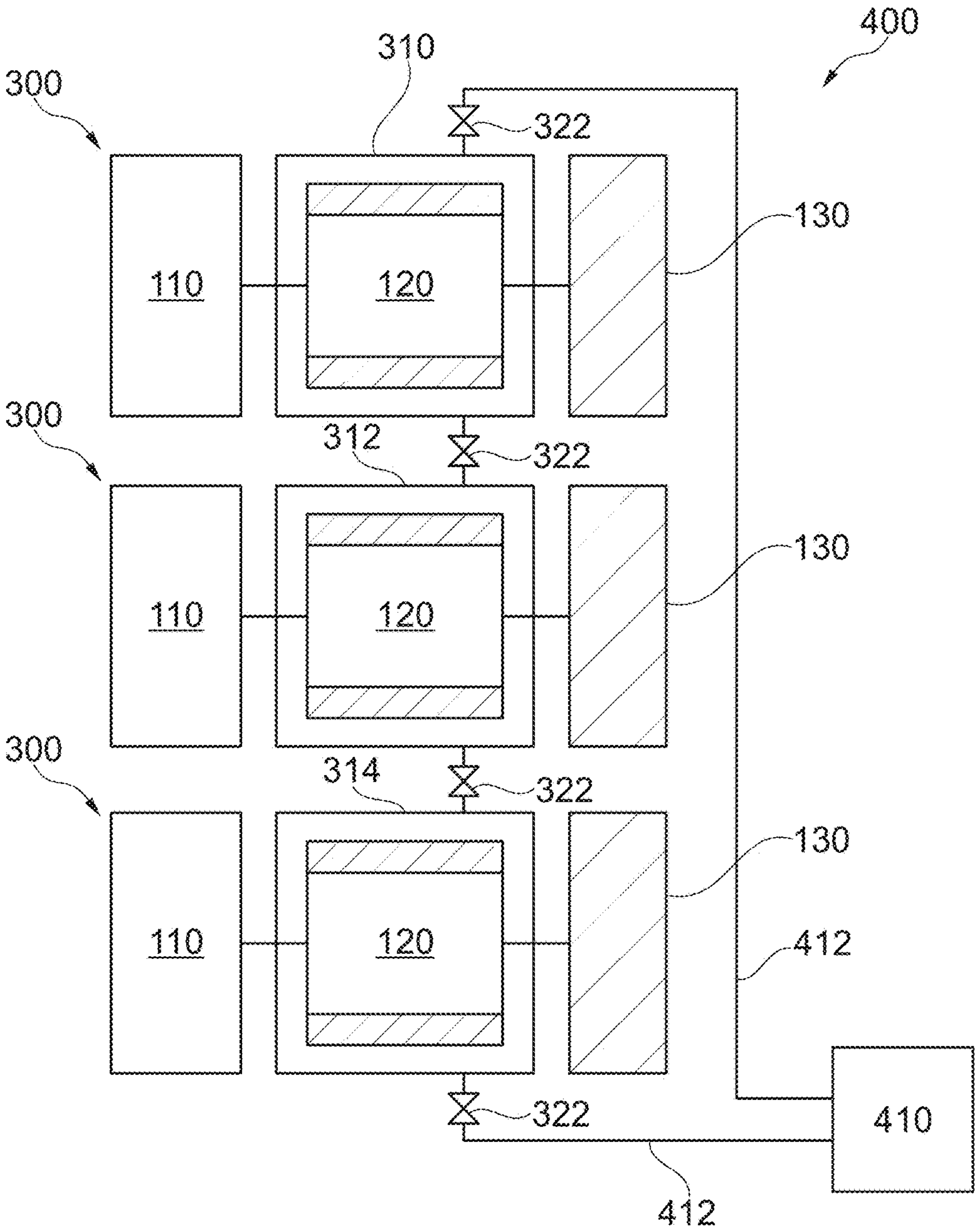
FIG. 4 schematically shows a converter according to embodiments.

According to embodiments, the connectors 320 may be connected to a fluid circuit, such as the fluid circuit shown in FIG. 4. The fluid circuit may be configured for circulating the fluid, e.g., by pumping the fluid. The fluid may act as a cooling fluid. For example, the fluid may transfer heat generated during operation of the converter 300 to a heat exchanger and/or a cooling structure, such as a heat exchanger provided within the fluid circuit, or even heat exchangers such as cooling fins and/or radiators provided on the outside of the container 310. Accordingly, particularly in embodiments in which a heat exchanger is provided on the outside of the container 310, the fluid may act as a cooling fluid independently from being circulated, and transfer heat generated by the MFT 120 e.g., through convection of the fluid within the volume. According to embodiments, additionally or alternatively, a heat exchanger, such as a water cooled heatsink, may be provided within the container 310. The water cooled heatsink may be connected in a water-based fluid circuit, similar to the fluid circuit described with reference to FIG. 4.

According to embodiments, the container 310 is formed of a non-conductive, electrically non-conductive and/or dielectric material. The container and/or the material may be heat-conductive. In particular, the container 310 may be formed of a polymer and/or a composite material. Non-conductive materials may include materials such as plastic, composite material, fiberglass, rubber, or any other material that is non-conductive and suitable for holding the fluid. Beneficially, a non-conductive material may be particularly suitable for a MFT 120 operating at a medium frequency, such as a frequency that is higher than the grid frequency. In particular, a heating of the container 310 due to induction and/or eddy currents may be mitigated by providing the non-conductive material.

According to embodiments, the container 310 includes one or more terminals for electrically connecting the medium voltage stage 110 and/or the DC output stage 130. The terminals, such as a first terminal, may be configured for connecting the medium voltage stage 110 to the MFT 120. The terminals, such as a second terminal, may be configured for connecting the MFT 120 to the DC output stage. The terminals may be openings within one or more walls of the container 310, the openings feeding one or more conductors through the container to provide an electrical connection from an outside of the container 310 to the volume of the container 310. In some instances, the terminals may be considered bushings, however, the bushings may be different, especially smaller than the air-type bushing 210 shown in FIG. 2. In some embodiments, the terminals may be configured for attaching a cable shoe to the terminal. The terminals may include and/or provide a seal, such a seal suitable for sealing the volume, e.g., to prevent leakage of a fluid provided within the volume.

Referring now to FIG. 4, a converter 400 according to an embodiment is described. The converter 400 may include converter modules, such as several converters 300 described with reference to FIG. 3, e.g., several converters 300 may be provided, for example in a configuration according to the circuit diagram shown in FIG. 1.

Only the differences with respect to the converter 300 shown in FIG. 3 will be described. Some features of the converter 400 have been omitted and/or generalized in the figure for clarity.

As shown in FIG. 3, three converters 300 are provided as modules, each module including a MFT 120 provided within a container 310, 312, 314. The containers 310, 312, 314 may be a container such as the container 310 described with reference to FIG. 3. The modules may be stacked horizontally, vertically, or in a combination thereof.

The containers 310, 312, 314 are fluidly connected to at least one other container of the containers 310, 312, 314 via connectors, such as the connectors 320 described with reference to FIG. 3. Each connector includes a valve 322, which is configured for fluidly separating the containers from the fluid circuit, and/or from an adjacent container when the valve is closed.

According to embodiments, a connector of a first container 310, 312, 314 may be the connector of a second container 310, 312, 314. In other words, for example, the connector provided between the container 310 and the container 312 may be a connector of both the container 310 and the container 312.

According to embodiments, one or more, or even all of the connectors may include more than one valve, such as two valves, provided in series. This may allow a container to be separated from the fluid circuit and/or adjacent, fluidly connected containers, without having to drain either of the container to be connected, the adjacent containers, and/or the fluid circuit. For example, a disconnectable connection may be provided within the connector between two valves, and the disconnectable connection may be opened without efflux of the fluid after closing the two valves.

As shown in FIG. 4, the converter 400 includes a fluid circuit. The containers 310, 312, 314 are adjacently arranged and fluidly connected via the connectors. The containers 310, 312, 314 form a portion of the fluid circuit, e.g., a fluid may flow from an inlet of e.g., the container 310 to an outlet of the container 314 or vice versa. In the example shown in FIG. 4, the containers 310, 312, 314 are connected in series in the fluid circuit. Likewise, additionally or alternatively, some of the containers of the converter 400 may be connected in parallel, and/or the converter 400 may include a plurality of series connected containers connected in parallel. For example, the converter 400 may include nine converter modules in a 3×3 configuration, e.g., having three converters 400 configured as shown in FIG. 4 connected in parallel to the fluid circuit. Likewise, depending on the configuration of the converter 400, e.g., the desired converter design, the converter 400 may include 2, 4, 5, 6, 7, 8, 9, or even 10 or more converters 300 connected in series and/or parallel in the fluid circuit.

The fluid circuit further includes the conduits 412, connecting the outermost containers 310 and 314 to a pump 410. The pump 410 may be configured for circulating the fluid in the fluid circuit. The pump 410 may be provided inside the cabinet 150, or even outside the cabinet 150.

According to embodiments, multiple pumps 410 may be provided, e.g., to form separate fluid circuits within the converter 400. In one example, a separate pump and/or fluid circuit may be provided for each container 310, 312, 314.

According to embodiments, in addition to the pump, the fluid circuit may include additional components, such as tanks and/or reservoirs, such as equalizing tanks, and/or pressure regulators, filling and/or outlet ports, or the like.

According to embodiments, in addition, or alternatively to a heat exchanger provided at a container 310, 312, 314, one or more heat exchangers for cooling the fluid, such as an oil/water heat exchanger, or even an oil/air heat exchanger, may be provided at a location within the fluid circuit other than the container 310, 312, 314.

According to embodiments, the fluid circuit may include a fluid monitor, such as a fluid monitoring device. The fluid monitor may include one or more sensors for sensing one or more properties of the fluid. For example, the fluid monitor may include a temperature sensor for sensing a temperature of the fluid. For example, the fluid monitor may include a sensor for sensing a degradation of the fluid, such as an optical sensor, e.g., for sensing an absorbance and/or turbidity of the fluid. The fluid monitor may include sensors for detecting particles within the fluid. The fluid monitor may include a flow sensor. The fluid monitor may include a pressure sensor. The fluid monitor may be connected or connectable to an alarm system, the alarm module being configured for generating a warning signal, e.g., when one or more of the sensor signals sensed by the fluid monitor are determined to be outside a predefined threshold and/or range.

According to an aspect, the fluid monitor and/or the alarm system may further include a network interface for connecting the device to a data network, in particular a global data network. The data network may be a TCP/IP network such as Internet. The fluid monitor and/or the alarm system is operatively connected to the network interface for carrying out commands received from the data network. The commands may include a control command for controlling the fluid monitor and/or the alarm system to carry out a task such as monitoring the fluid, and/or measuring and/or transmitting parameters of the fluid. In this case, the fluid monitor and/or the alarm system is adapted for carrying out the task in response to the control command. The commands may include a status request. In response to the status request, or without prior status request, the fluid monitor and/or the alarm system may be adapted for sending a status information and/or an alarm to the network interface, and the network interface is then adapted for sending the status information and/or the alarm over the network. The commands may include an update command including update data. In this case, the fluid monitor and/or the alarm system is adapted for initiating an update in response to the update command and using the update data.

The data network may be an Ethernet network using TCP/IP such as LAN, WAN, or Internet. The data network may include distributed storage units such as Cloud. Depending on the application, the Cloud can be in form of public, private, hybrid, or community Cloud.

While the converter 100 and/or 400 has been described as including three converter modules, a converter including containers 310 and/or the fluid circuit according to embodiments described herein may be particularly suitable for a converter including a plurality of modules, such as more than 3 modules, such as 6 or more modules, 9 or more modules, 12 or more modules, 15 or more modules, or even 20 or more modules, such as 21 modules. Beneficially, even a converter based on a plurality of modules may be provided with a low footprint and/or high power density, since the unutilized space required for providing a plurality of air-type bushings is not present in the proposed solution. Each of the modules may be a converter and/or solid state transformer, e.g. as described with reference to FIG. 3. The solutions proposed herein may beneficially provide improved scalability, in particular, a plurality of low-power converter modules may be provided and/or combined into a higher power converter. Beneficially, the low-power converter modules may employ low-cost power semiconductor switches in the low-voltage range, such as 1.2 kV IGBTs instead of 3.3 kV SiC MOSFETs. Beneficially, since only the MFT 120 is immersed in the insulating fluid, the insulating fluid does not affect the electronic components of the converter, such as the components of the inverter circuit.

Figure 5:
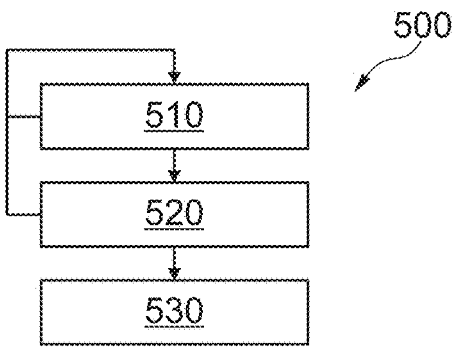
FIG. 5 shows a method of operating a converter according to embodiments.

Referring now to FIG. 5, a method 500 of operating a converter according to embodiments described herein is described.

In operation 510, the converter is operated, e.g., according to known methods to operate a converter and/or solid state transformer. Operation 510 includes circulating a fluid in the fluid circuit to cool the MFT 120. The operation 510 may include providing the valves 522 in an open state, to allow a circulation of the fluid, e.g., to allow the fluid to operate as a cooling fluid. Accordingly, the fluid may be unobstructed by a valve. Operation 510 may include converting and/or transforming a medium voltage AC power, such as a power received from a medium voltage grid 140, into a low voltage DC power, such as a low voltage DC power provided to the low voltage DC output 132.

Optionally, according to embodiments, the method 500 may include monitoring 520 the fluid. Monitoring the fluid may include utilizing a fluid monitor, such as the fluid monitor described with reference to FIG. 4. Monitoring 520 the fluid may include determining if a fault is present in the system. In particular, monitoring 520 may include determining if the converter is operating normally, e.g., by determining if the flow rate, pressure and/or temperature of the fluid is within predetermined limits. Monitoring the fluid may include determining a fluid degradation. A fluid degradation may indicate a degradation of the fluid, e.g., due to chemical processes and/or aging of the fluid. Furthermore, a fluid degradation may include the presence of chemical and/or physical components, such as particles, within the fluid, which may indicate the deterioration of components of the converter and/or the fluid circuit, such as the MFT 120, the pump 410, a heat exchanger, a valve, a conduit, a connector, or other components of the converter having contact with the fluid.

Monitoring 520 the fluid may include determining if a fault is present in the converter, e.g., by determining if the parameters and/or values determined by the fluid monitor are within predefined ranges. Under the proviso that a fault is present, the method 500 may include operation 530.

In operation 530, a fault was detected, and actions are performed in response to the fault. Operation 530 may include indicating the fault, e.g., by providing a warning signal, e.g., by an alarm module. Operation 530 may include deactivating, e.g., powering down, the converter, e.g., by disconnecting the converter from the grid 140, to put the converter in an unpowered state. In case the converter includes a plurality of fluid circuits, only the modules associated with the fluid circuit may be deactivated. Operation 530 may include performing maintenance on the converter.

In some embodiments, e.g., after identifying the fault to be caused by one of the converter modules, operation 530 may include closing one or more valves 322 to separate at least one of the plurality of containers, such as containers 310, 312, 314, from the fluid circuit. After the container has been separated from the fluid circuit, the container including the MFT, or even the whole converter module may be removed from the converter, e.g., for maintenance and/or replacement with a replacement converter module.

According to embodiments, the operation 530 may be performed independently of a fault being detected within the fluid circuit. For example, a fault which does not affect the fluid circuit may be present in one of the modules, and the operation may be performed accordingly.

What is claimed is:

1. A converter comprising:
- at least one medium voltage stage comprising an inverter circuit;
- at least one medium frequency transformer, a first winding of the medium frequency transformer being electrically connected to the medium voltage stage;
- at least one DC output stage, the DC output stage being electrically connected to a second winding of the medium frequency transformer; and
- a plurality of containers having a volume;
- wherein each container is configured for holding an electrically insulating fluid inside the volume;
- wherein each container has provided within the container one of the at least one medium frequency transformer to be electrically insulated by the fluid;
- wherein the container includes at least one connector for fluidly connecting the volume with a fluid circuit; and
- wherein a first container of the plurality of containers is fluidly connected to a second container of the plurality of containers via the connector, the at least one connector comprising a valve for opening and/or closing the connector, wherein the valve is configured for fluidly separating the first container from the second container when the connector is closed by the valve.

2. The converter according to claim 1, wherein the plurality of containers is formed of a non-conductive material.

3. The converter according to claim 1, wherein the medium voltage stage comprises one or more selected from the group consisting of
- a line interphase transformer connectable to a medium voltage AC power;
- a rectifier configured to provide a medium voltage DC power; and
- the inverter circuit for providing a medium frequency AC power.

4. The converter according to claim 1, wherein the converter is configured to convert a medium voltage AC power into a low voltage DC power.

5. The converter according to claim 1, wherein the converter comprises a solid state transformer.

6. The converter according to claim 1, wherein the medium voltage stage is insulated from a ground potential; and
- wherein the DC output stage is connected to an earthing system defining the ground potential.

7. The converter according to claim 1, wherein the DC output stage comprises a rectifier configured to convert a medium frequency low voltage AC power into a low voltage DC power.

8. The converter according to claim 1, wherein the second winding of the medium frequency transformer is electrically connected to the ground potential.

9. The converter according to claim 1, wherein the fluid circuit is configured to circulate the fluid, wherein the fluid is a cooling fluid.

10. The converter according to claim 1,
- wherein each container includes one or more terminals for electrically connecting the medium voltage stage and/or the DC output stage, and
- wherein the terminals provide an electrical connection from an outside of the container to the volume.

11. The converter according to claim 1, wherein the plurality of containers is adjacently arranged and fluidly connected so that the plurality of containers forms a portion of the fluid circuit.

12. The converter according to claim 11, wherein the plurality of containers is fluidly connected in series.

13. The converter according to claim 1, further including a pump configured to circulate the fluid in the fluid circuit.

14. The converter according to claim 1, wherein a core of the medium frequency transformer is electrically connected to a ground potential.

15. The converter according to claim 1, further comprising a heat exchanger configured to cool the fluid.

16. A method of operating a converter, the method comprising:
- providing the converter, the converter including:
  - at least one medium voltage stage including an inverter circuit;
  - at least one medium frequency transformer, a first winding of the medium frequency transformer being electrically connected to the medium voltage stage;
  - at least one DC output stage, the DC output stage being electrically connected to a second winding of the medium frequency transformer; and
  - a plurality of containers having a volume;
  - wherein each container is configured to hold an electrically insulating fluid inside the volume;
  - wherein each container has provided within the container one of the at least one medium frequency transformer to be electrically insulated by the fluid;
  - wherein the container includes at least one connector for fluidly connecting the volume with a fluid circuit; and
  - wherein a first container of the plurality of containers is fluidly connected to a second container of the plurality of containers via the connector, the at least one connector including a valve configured to open and/or close the connector, wherein the valve is further configured to fluidly separate the first container from the second container when the connector is closed by the valve, the method further comprising:

while the fluid circuit is unobstructed by the valve, converting a medium voltage AC power into a low voltage DC power while circulating the fluid in the fluid circuit to cool the medium frequency transformer.

17. The method according to claim 16, further comprising:

while the converter is in an unpowered state, closing the one or more valves to separate at least one of the plurality of containers from the fluid circuit.

18. The method according to claim 16, further comprising:

monitoring the fluid; and under the proviso that the monitoring indicates a fault, while the converter is in an unpowered state, closing the one or more valves to separate at least one of the plurality of containers from the fluid circuit.

* * * * *